(12) United States Patent
Brunschwiler et al.

(10) Patent No.: US 9,189,037 B2
(45) Date of Patent: Nov. 17, 2015

(54) OPTIMIZING HEAT TRANSFER IN 3-D CHIP-STACKS

(75) Inventors: Thomas Brunschwiler, Thalwil (CH); Eren Kursun, Yorktown Heights, NY (US); Gary W Maier, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 749 days.

(21) Appl. No.: 13/494,047

(22) Filed: Jun. 12, 2012

(65) Prior Publication Data

US 2013/0331996 A1  Dec. 12, 2013

(51) Int. Cl.
*G06F 1/20* (2006.01)
*H01L 25/065* (2006.01)

(52) U.S. Cl.
CPC .............. *G06F 1/20* (2013.01); *H01L 25/0657* (2013.01); *H01L 2924/0002* (2013.01)

(58) Field of Classification Search
CPC ................. G06F 1/20; H01L 25/0657; H01L 2924/0002
USPC ................................................. 700/281–283
See application file for complete search history.

(56) References Cited

U.S. PATENT DOCUMENTS

| 6,389,582 | B1 | 5/2002 | Valainis et al. |
| 7,222,058 | B2 | 5/2007 | Miller |
| 7,781,263 | B2 | 8/2010 | Winter et al. |
| 7,823,102 | B2 | 10/2010 | Chandra et al. |
| 7,870,893 | B2 | 1/2011 | Ouyang et al. |
| 2005/0205241 | A1 | 9/2005 | Goodson et al. |
| 2008/0116921 | A1* | 5/2008 | Cote et al. ...................... 324/760 |
| 2008/0253085 | A1 | 10/2008 | Soffer |
| 2010/0314088 | A1* | 12/2010 | Yoo et al. ....................... 165/170 |

FOREIGN PATENT DOCUMENTS

WO    WO 2009037648 A2    3/2009

OTHER PUBLICATIONS

Chen et al., "Direct Liquid Cooling of a Stacked Multichip Module," Electronics Packaging Technology Conference, 2002, 4th.
Koo et al., "Integrated Microchannel Cooling for Three-Dimensional Electronic Circuit Architectures," Journal of Heat Transfer, Jan. 2005, vol. 127 / 49.

* cited by examiner

*Primary Examiner* — Mohammad Ali
*Assistant Examiner* — Nathan Laughlin
(74) *Attorney, Agent, or Firm* — Scully, Scott, Murphy & Presser, P.C.

(57) ABSTRACT

A computer-implemented method, system, and article of manufacture for optimizing heat transfer in a 3-D chip-stack. The method includes the steps of: receiving a heat-removal effectiveness parameter for a plurality of channel-region areas in the chip-stack, receiving at least one of a flow value and temperature value for at least two of the channel-region areas, comparing the received values for different channel-region areas, and adjusting a flow rate of a liquid flowing to at least one of the two channel-region areas based on the heat-removal effectiveness parameter of the channel-region area receiving the adjustment and the results of the comparison step, where at least one step is carried out using a computer device.

22 Claims, 13 Drawing Sheets

OPTIMIZING HEAT TRANSFER IN 3-D CHIP-STACKS

BACKGROUND OF THE INVENTION

1. Field of the Invention

This invention relates to optimizing heat-transfer in 3-D chip-stacks. More particularly, this invention relates to optimizing heat-transfer in 3-D chips stacks using a heuristic approach.

2. Related Art

Three-dimensional integrated circuits are prevalent in today's semiconductor industry because they address and overcome several technical shortcomings. For instance, 3-D packaging, which involves stacking several chips into a single package, provides at least a partial remedy to the scaling obstacles presented by two dimensional alternatives.

Nevertheless, one problem presented by Three-dimensional stacks ("3-D chip-stacks") is that the proximity amongst the stacked layers can cause temperature variations that either damage the layers, or components therein, or make the layers, or components therein, operate improperly. For instance, "hot spots" can occur in certain areas of the chip, which can dramatically impede performance, and even permanently damage the chip.

The methods and systems for addressing the temperature and flow variations in 3-D chip-stacks are flawed for a variety of reasons, including lacking the ability of adequately eliminating hot-spots throughout the chip-stack, and for not being versatile enough to address the temperature and flow needs at particular portions of the 3-D chip-stack without compromising the needs of other portions of the chip-stack (which in turn affects the performance of the chip-stack as a whole).

Consequently, a need has developed to address the concerns presented by this problem.

SUMMARY OF THE INVENTION

A computer-implemented method for optimizing heat transfer in a 3-D chip-stack. The method includes the steps of: receiving a heat-removal effectiveness parameter for a plurality of channel-region areas in the chip-stack, receiving at least one of a flow value and temperature value for at least two of the plurality of channel-region areas, comparing the received values for different channel-region areas, and adjusting a flow rate of a liquid flowing to at least one of the two channel-region areas based on the heat-removal effectiveness parameter of the channel-region area receiving the adjustment and the results of the comparison step, where at least one step is carried out using a computer device.

A heat optimization computer system for optimizing heat transfer in a 3-D chip-stack. The system includes: a control mechanism for supplying liquid to the chip-stack, a receiving unit for receiving a heat-removal effectiveness parameter for a plurality of channel-region areas in the chip-stack and for receiving at least one of a flow value and temperature value for at least two of the plurality of channel-region areas, and an adjusting unit that instructs the control mechanism as to the manner that the control mechanism is to supply flow rate of liquid to at least one of the at least two channel-region areas, where the adjustment is based on the heat-removal effectiveness parameter of the channel-region area receiving the adjustment and the results provided by the comparison unit.

A non-transitory article of manufacture tangibly embodying computer readable instructions which when implemented cause a computer to carry out the steps of a method for optimizing heat transfer in a 3-D chip-stack. The method includes the steps of: receiving a heat-removal effectiveness parameter for a plurality of channel-region areas in the chip-stack, receiving at least one of a flow value and temperature value for at least two of the plurality of channel-region areas, comparing the received values for different channel-region areas, and adjusting a flow rate of a liquid flowing to at least one of the two channel-region areas based on the heat-removal effectiveness parameter of the channel-region area receiving the adjustment and the results of the comparison step.

BRIEF DESCRIPTION OF THE DRAWINGS

The flowcharts and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions. The following figures are included.

DETAILED DESCRIPTION OF THE PREFERRED EMBODIMENTS

It will be readily understood that the embodiments of the present invention, as generally described and illustrated in the figures herein, may be arranged and designed in a wide variety of different configurations in addition to the described presently preferred embodiments. Thus, the following detailed description of the embodiments of the present invention, as represented in the figures, is not intended to limit the scope of the invention, as claimed, but is merely representative of selected presently preferred embodiments of the invention. The following description is intended only by way of example, and simply illustrates certain selected presently preferred embodiments of the invention as claimed herein.

Figure 1:
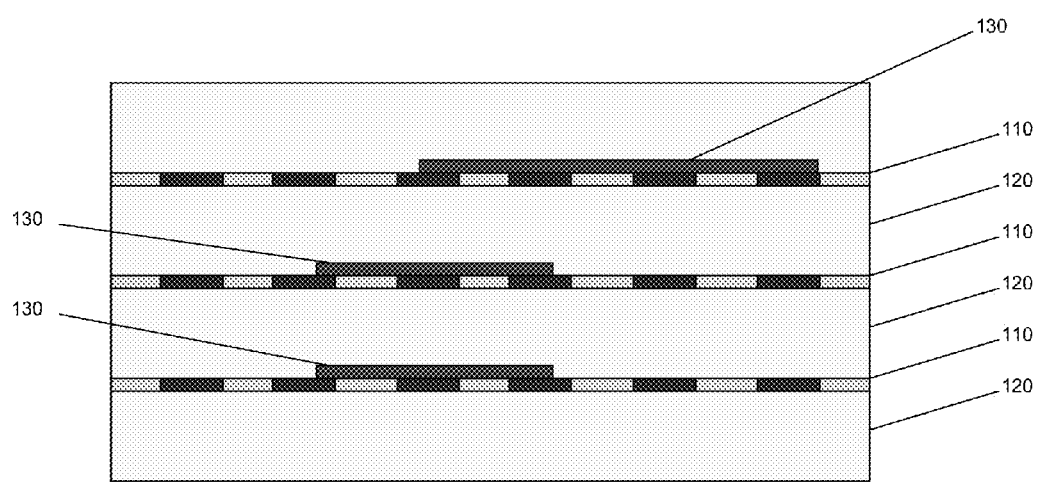
FIG. 1 is a depiction of an exemplary 3-D chip-stack with hot spot regions.

FIG. 1 displays a conventional 3-D chip-stack. The stack includes micro-channels 110, layers 120, which can be silicon device layers, and hot spots 130. Hot spots occur when a particular area of a chip-stack has become too hot, i.e. suffers from an excessive temperature increase, to function correctly. This is particularly true during the Burn-In Test Interface.

Hot spots can adversely affect the performance and manufacture of 3-D chip-stacks. To rectify this problem and other problems, heating liquid, coolant liquid, or a combination of heating liquid and cooling liquid can be introduced into the stack. Depending on the operational mode at issue the type of liquid used can differ, i.e. for the burn-in-state it can be heating liquid to burn in the chip, it can be coolant liquid when the chip is being cooled to rectify a hot spot or because reducing the temperature is otherwise beneficial, and it can be a combination of heating and cooling liquid when other thermal effects are sought.

The state of the art enables the delivery of liquid to be extremely close to a desired area, i.e. 1 mm, which permits high granularity.

Figure 2A:
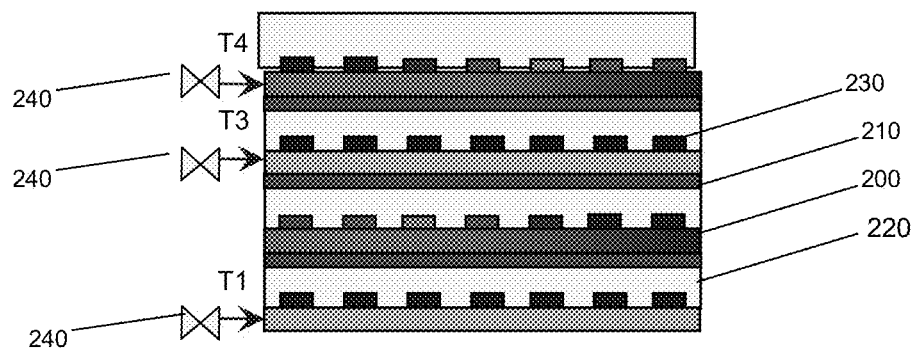
FIG. 2(a) is a depiction of a control mechanism that employs thermal diodes for administering coolant liquid to channel-region areas in a 3-D chip-stack.

FIG. 2(a) displays a basic scheme for delivering liquid to a 3-D chip-stack. The stack includes cavities for delivering the liquid 200, thermal barriers 210, dies 220, channels 230, and a control mechanism that uses thermal diodes 240 for delivering liquid to the stack. The control mechanism is exemplary, and those skilled in the art will recognize many control systems for delivering fluid to the stack, such as an embedded Spatial Burn In Controller System (eSBCS), as discussed below, or a special Burn In Test Interface (BTI), without departing from the spirit of the invention.

The cavities 200 can be used to individually stress each layer in the stack by supplying liquid in a manner that facilitates the appropriate inlet temperature, T1, T2, . . . , Tn.

Flow rates, direction, redistribution and fluid temperature can be changed dynamically to address different areas by monitoring spatial temperatures of each die 220 and region in a 3-D chip-stack by using thermal diode outputs 240, which are fed into a eSBCS. Then, the eSBCS adjusts fluid parameters to meet conditions, such as, for example, those predetermined in Burn-In for each region of a heterogeneous chip-stack.

Figure 2B:
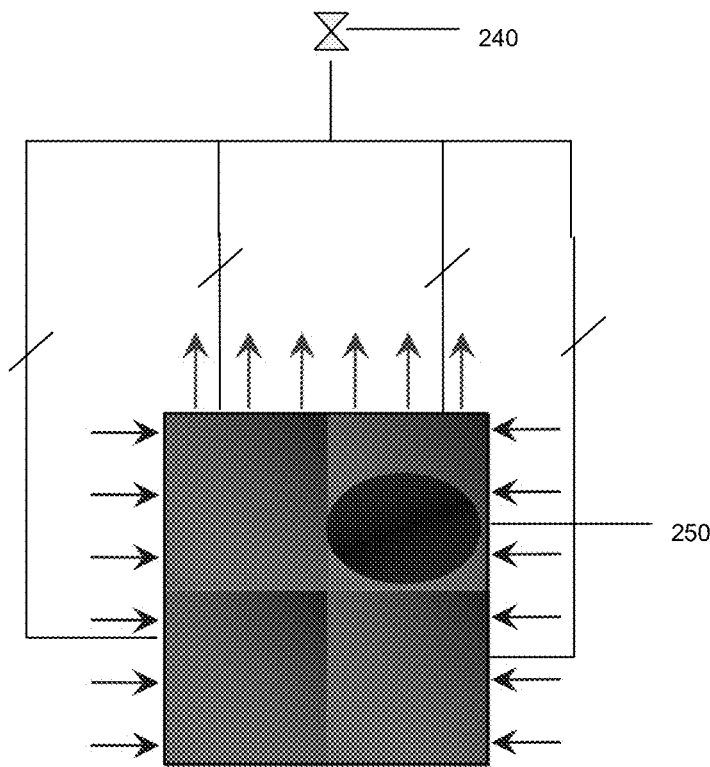
FIG. 2(b) is a depiction of a control mechanism that employs thermal diodes for administering coolant liquid to channel-region areas in a 3-D chip-stack.

FIG. 2(b) illustrates an example, from a flow perspective, of a control system delivering coolant liquid to a chip-stack to rectify a hot spot 250 and to cool other parts of the stack. The thermal diode 240 delivers coolant liquid that causes portions of the chip to cool. The coolant liquid entering the stack is represented by the arrows entering the chip, and heat exiting the chip is represented by the arrows exiting the chip. Also, it should be noted that arrows entering the chip represent coolant liquid flowing into the chip, which will cool portions of the chip as it flows through, and the arrows leaving the chip represent heat leaving the chip, which is equivalent to a temperature reduction, which can be for the chip as a whole or a portion of the chip.

Figure 3A:
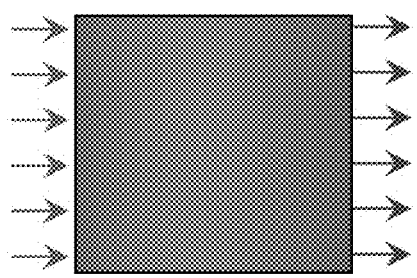
FIG. 3(a) depicts a 2-port manifold with unidirectional flow useful for administering liquid in a 3-D chip-stack.
Figure 3B:
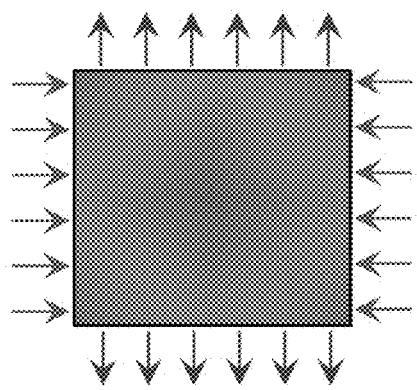
FIG. 3(b) depicts a 2-port manifold with x cavities having an x-directional flow and y cavities having a y-directional flow useful for administering liquid in a 3-D chip-stack.
Figure 3C:
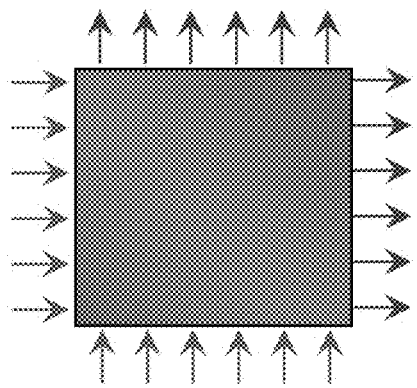
FIG. 3(c) depicts a 4-port manifold with corner flow useful for administering liquid in a 3-D chip-stack.
Figure 3D:
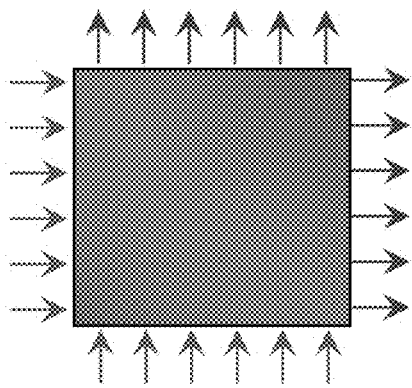
FIG. 3(d) depicts 4-port manifold with diagonal flow useful for administering liquid in a 3-D chip-stack.
Figure 4:
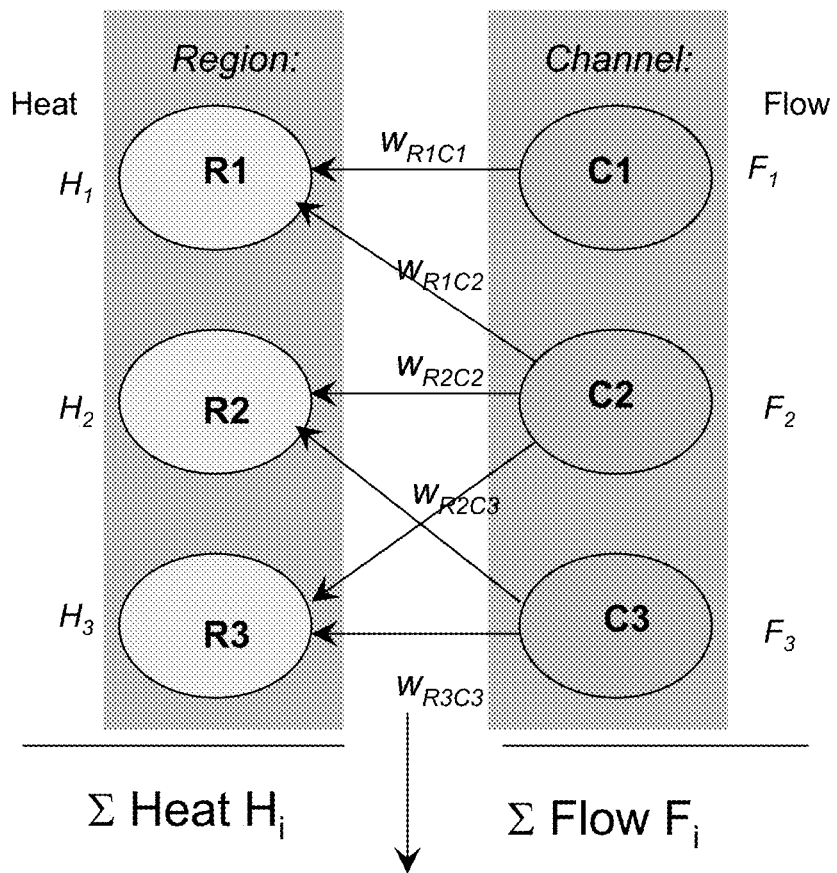
FIG. 4 illustrates an approach and computer-implementable process according to an embodiment of the present invention.

FIGS. 3(a), 3(b), 3(c), and 3(d) show different and exemplary manifolding schemes that can be used in 3-D chip-stacks for the fluid delivery via the cavities, such as 2-port with fluid flowing in a unidirectional manner FIG. 3(a), 2-port with odd cavities having an x-directional flow and y cavities having a y-directional flow FIG. 3(b), 4-port with corner flow FIG. 3(c), and 4-port diagonal flow FIG. 3(d). This variety increases flexibility in administering the coolant or heating liquid (Note that the number associated with the port indicates cavities for fluid delivery, i.e. 2-port equates with 2-cavities and 4-port equates with 4-cavities). Note also that FIGS. 3(a), 3(b), 3(c), and 3(d) illustrate the example where coolant liquid is delivered to reduce temperatures with coolant fluid entering the stack and heat leaving the stack. The entering arrows in all of FIGS. 3(a), 3(b), 3(c), and 3(d) represent coolant liquid flowing in, and similarly the arrows pointing away from the stacks in those figures represents heat leaving.

An N-port with a fluid network with an embedded monitoring and control system can direct liquid, i.e. coolant liquid, heating liquid, or a combination of coolant and heating liquid, to desired locations, by using, for instance, high pin density at hot spot locations, guiding structures to locally increase the fluid velocity, a combination of off chip and on chip MEMS mechanical flow control systems controlled by an on chip and/or off chip temperature monitoring and control system, or for instance, the thermal diode output illustration supplied above and implemented in 2100, which is described below.

Those skilled in the art will appreciate additional ways of creating a system capable of delivering liquid in a 3-D chip-stack, either by using the techniques described herein, a combination therefrom, or additional techniques known in the art and not explicitly discussed herein.

Further, it should be apparent that as liquid passes through cavities, the flow and change in pressure can affect the temperature of a 3-D chip-stack in any number of different manners, and can be accordingly manipulated.

FIG. 4 illustrates an embodiment of a heuristic approach and computer-implementable process to optimize heat transfer in a 3-D chip-stack using liquid according to the present invention. This approach utilizes heat-removal effectiveness parameters for a given channel region area.

A channel-region area is an area that includes at least one region in the 3-D chip-stack connected to at least one channel in the 3-D chip-stack. A heat-removal effectiveness parameter, $WR_NC_N$, is a parameter that refers to the degree to which a channel can remove heat from a region that it is connected to; for example, $WR_1C_1$ refers to the ability of channel 1 to remove heat from region 1, $WR_1C_2$ refers to the ability of channel 2 to remove heat from region 1, $WR_2C_2$ refers to the ability of channel to 2 to remove heat from region 2, etc. (Note that the definition of channel as used herein includes junctions and all other similar variations).

The heat-removal effectiveness parameter can be computed by i) the distance between a channel and the region to which it connects and/or ii) by assessing the material properties of the region, the channel, and the manner in which they relate. The heat-removal effectiveness parameter can also be computed or determined by using other physical parameters known to those skilled in the art as affecting thermal and temperature aspects of objects, alone or in combination with one or both of the two parameters explicitly provided. The heat-removal effectiveness parameter or parameters can be received (from a prior experiment, measurement, or computation) or computed, and should be preferably done so, and stored, at design time.

As shown in FIG. 4, each region has a certain level of heat contained herein, i.e. $H_1$, $H_2$, $H_3$, and each channel has a particular flow associated with it, i.e. $F_1$, $F_2$, $F_3$, etc. Manipulating the flow pumping through the channels, and manipulating the heat by utilizing the heat-removal effectiveness parameters permits the achievement of a desired thermal and temperature environment in the chip-stack. In one embodiment, it is desirable to minimize the sum of the flow rates (Minimize $\Sigma$ Fi), which is related to pump power, and to maximize the sum of the heat-removal effectiveness parameters (Maximize $\Sigma$ wRC). This will reduce the effects of hot spots throughout the chip-stack by achieving optimal heat-removal.

The above approach works for any number of channel-region areas, and it can include all of the conceivable channel-region areas in the chip-stack. In one embodiment, it can be used on at least two channel-region areas in the chip-stack, where there are at least a total of two channels amongst the at least two channel-region areas, and where a heat-removal effectiveness parameter is obtained for each one of the channel-region areas.

Another embodiment of the Present Invention uses the approach illustrated in FIG. 4 to store and/or create one or more look-up table(s) that can incorporate within any one of or any combination of (i) the heat-removal effectiveness parameters of the channel-region areas, (ii) temperatures of the regions and channel-region areas, (iii) and/or any other flow-feature relationship for each channel-region combination. A simple exemplary embodiment is the table supplied directly below:

TABLE 1

|  | R1 | R2 | RN |
|---|---|---|---|
| Ch1 | f11 |  | f1N |
| Ch2 | f21 |  | f2N |

The results stored in the table can be used to Minimize $\Sigma$ Fi (related to pump power) and Maximize $\Sigma$ wRC by, in part, by determining which region requires additional liquid or less liquid based on its heat-removal effectiveness parameter(s) that are based on the channel(s) that connect to the region. This can be done for one or more regions in the stack.

Figure 5:
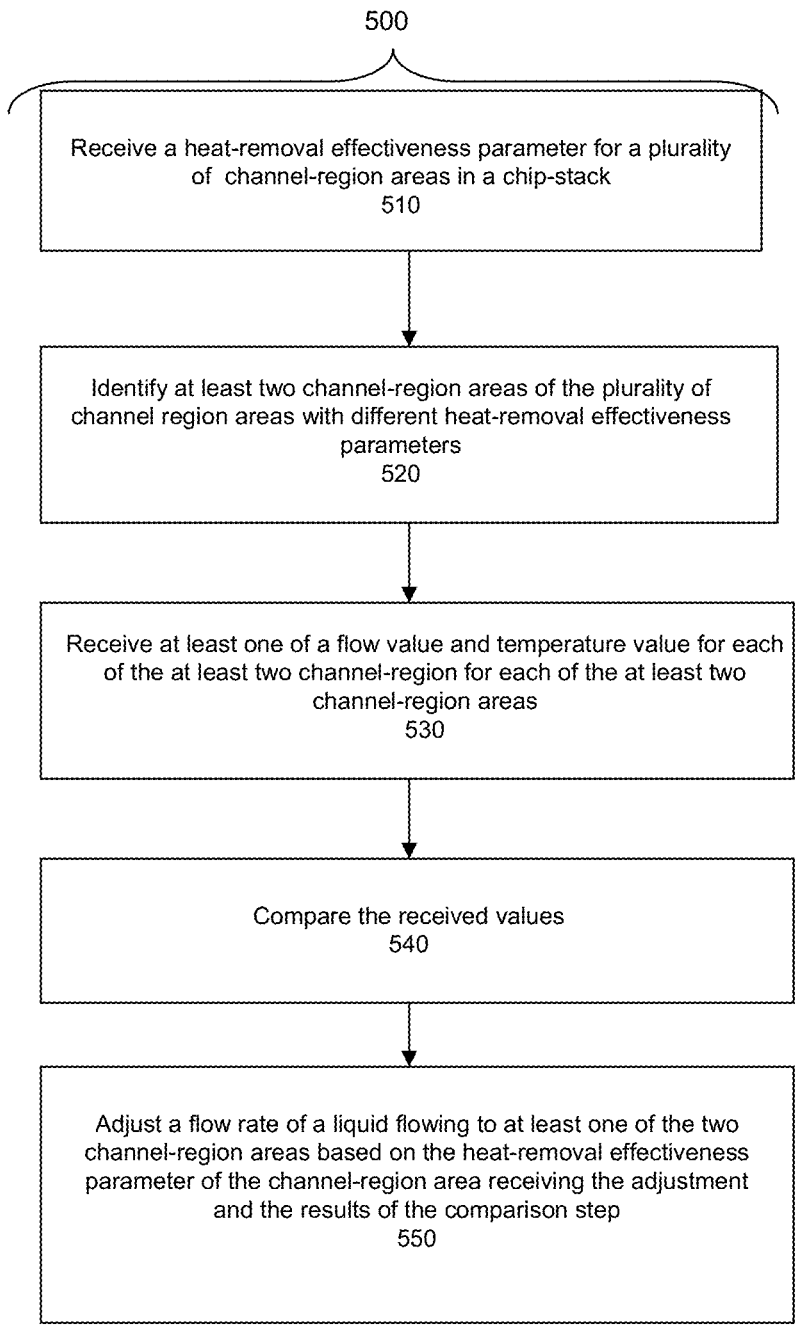
FIG. 5 is a block diagram that illustrates a computer-implemented method for optimizing heat transfer in a 3-D chip-stack according to an embodiment of the present invention.

Accordingly, one embodiment of the invention, as shown in FIG. 5, includes a computer-implemented method for optimizing heat transfer in a 3-D chip-stack using the principles and techniques outlined above.

The first step of the method 510 involves receiving a heat-removal effectiveness parameter for a plurality of channel-region areas in the chip-stack, where, as stated, a channel-region area includes at least one region in the 3-D chip-stack connected to at least one channel in the 3-D chip-stack. The stack can have one or more regions connected to one or more channels. Step 510 can optionally be replaced or followed with a step that actually computes the heat-removal effectiveness parameter by utilizing known or computed physical and material characteristics concerning the material or material(s) of the channel-region areas, such as measurements or other known quantities and qualities of the physical and material characteristics of the channels and the regions.

Step 520 involves identifying at least two channel-region areas of the plurality of channel-region areas with different heat-removal effectiveness parameters, i.e. channel-region 1 has a different heat-removal effectiveness parameter than channel-region 2.

The next step 530 involves receiving at least one of a flow value and temperature value for each of the at least two channel-region areas. A flow value can be a parameter that assesses the flow of liquid entering the channel-region area, such as the flow rate, and a temperature value can be one of the actual value of the temperature of a part or all of the channel-region area, the desired value of a part or all of the temperature of the channel-region area, a predicted value of the temperature of a part or all of the channel-region area, or a temperature value that a part or all of the channel-region area can have based on its physical and material parameters and the current and/or potential external circumstances. The next step 540 involves comparing the received values. This comparison can assess one or more differences or similarities for one or more of the values amongst two or more of the channel-region areas.

The next step 550 involves adjusting a flow rate of a liquid flowing to at least one of the two channel-region areas based on the heat-removal effectiveness parameter of the channel-region area receiving the adjustment and the results of the comparison step. The adjustment can be done using liquid that is heating liquid, coolant liquid, or a combination of heating liquid and cooling liquid, depending on the operational mode at issue, i.e. for the burn-in-state it can be heating liquid to burn in the chip, and it can be coolant liquid when the chip is being cooled. At least one step of the method must be carried out using a computer device.

The identifying step 520 is optional, and steps 510, 530, 540 and 550 can be carried out without it. This identifying can be done to (i) determine the order of the adjustment or (ii) establish a range for at least one of the values, i.e. the temperature range. For example, the channel-region areas with the higher-heat removal effectiveness parameters can be identified so that, depending on the specific needs at issue, they can receive a liquid adjustment first, last, or not at all, and/or so that a temperature range can be established.

In one embodiment, step 520 involves identifying the channel-region areas with the highest heat-removal effectiveness parameters relative to other channel-region areas. This permits the adjusting step to deliver liquid most efficiently depending on the circumstances. For instance, in the scenarios where coolant liquid is needed to reduce temperature throughout the chip, more liquid can be diverted to channel-region areas with lower heat-removal effectiveness parameters because the channel-region areas with higher heat-removal parameters lose heat more easily by their very nature, and as a result, require less coolant liquid to do so. The opposite can be done in scenarios where heating liquid is required because the channel-region areas with lower heat-removal parameters sustain heat with greater ease than channel-region areas with higher heat-removal effectiveness parameters.

In one embodiment the adjusting occurs in a manner that is proportionate to the heat-removal effectiveness parameter(s) of the channel-region area(s) receiving the adjustment and the results of the comparison step.

This method can utilize the channels in a manner that makes the channels operate as a shield that protects thermally sensitive lawyers. This can be done by selecting appropriate channel materials, arranging the channel-region areas in a way that places the thermally sensitive portions of the stack in a position that is minimally affected by heating conduction, and maximally affected by coolant liquid that removes heat from a given channel-region areas. It can also be done by the actual adjustment of coolant liquid, heating liquid, or a combination thereof.

Figure 6:
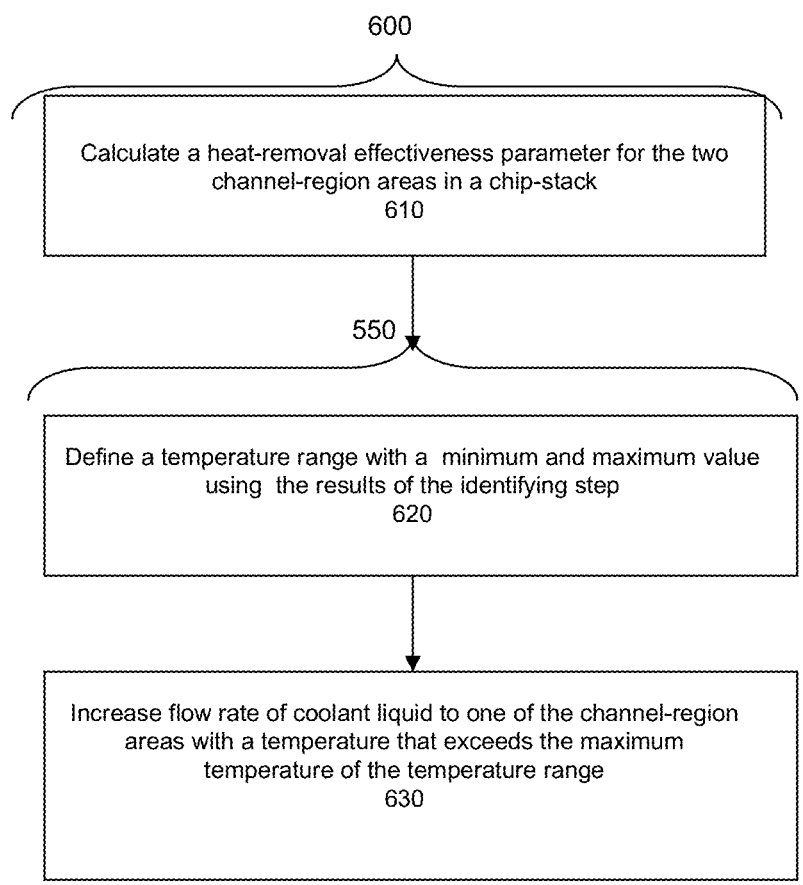
FIG. 6 is a block diagram that illustrates a computer-implemented method for optimizing heat transfer in a 3-D chip-stack according to an embodiment of the present invention.

Another embodiment of the Present Invention employs the above principles, and as show in FIG. 6, includes another method for optimizing heat transfer in a 3-D chip-stack using the principles outlined above by adding further steps to the method 500 by adding to the adjusting step 550.

The first step 610 is optional, and it involves calculating a heat-removal effectiveness parameter for each of the at least two channel-region areas in the chip-stack, where, again, a channel-region area includes at least one region in the 3-D chip-stack connected to at least one channel in the 3-D chip-stack. The computation, again, can be based on a parameter that is calculated by using the factors discussed at length above, including the i) distance between a channel and a region and ii) the effect of boundary materials connecting a channel and a region.

The next steps, 620 and 630, add further steps to the adjusting step 550. Step 620 involves defining a temperature range with a minimum and maximum value using the results of the identifying step. The next step 630 involves increasing flow rate of coolant liquid to at least one of the at least two channel-region areas with a temperature that exceeds the maximum temperature of the temperature range. At least one step must be carried out using a computer device.

The increasing in flow rate 630 can occur in a manner that is proportionate to i) a temperature difference between the excessive temperature and the maximum temperature of the temperature range and ii) the heat-removal effectiveness parameter of the channel-region area receiving the increased flow rate.

Figure 7:
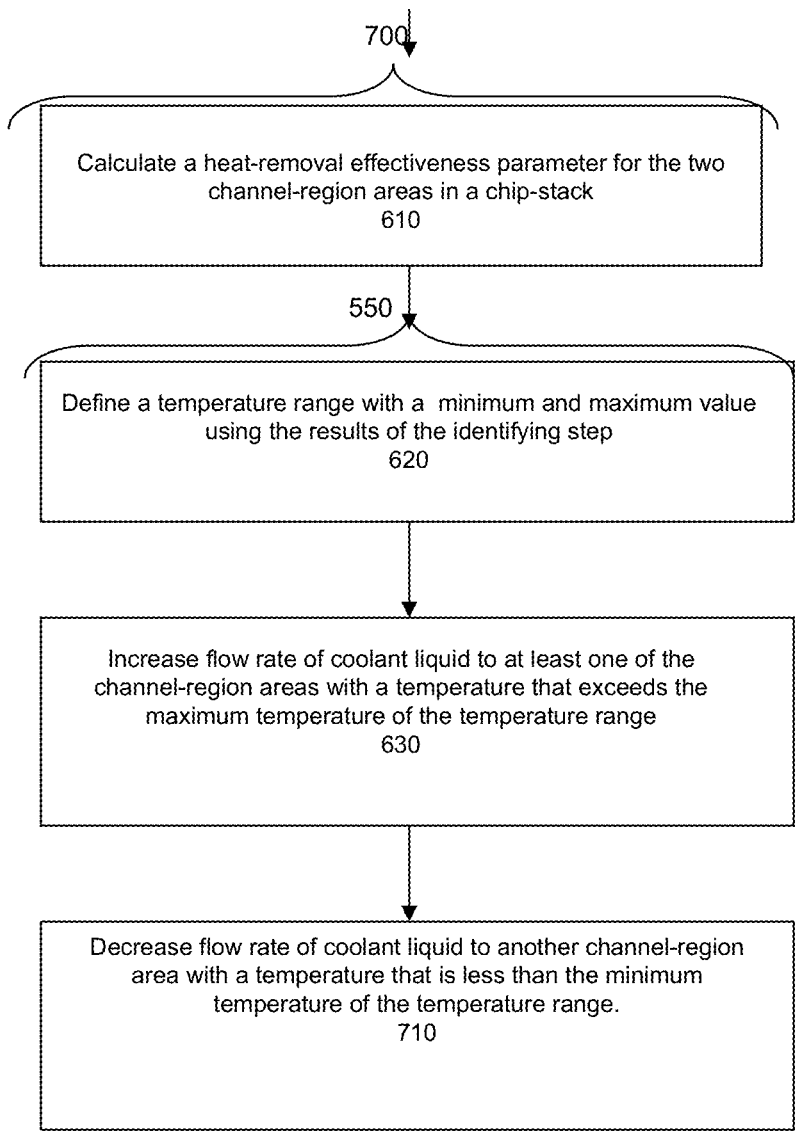
FIG. 7 is a block diagram that illustrates a computer-implemented method for optimizing heat transfer in a 3-D chip-stack according to an embodiment of the present invention.

Furthermore, the method of FIG. 6 can further include the step of decreasing flow rate of coolant liquid to another one of the at least two channel-region areas with a temperature that is less than the minimum temperature of the temperature range 710, as shown in FIG. 7. The decrease in flow rate can be done in a manner that is proportionate to i) a temperature difference between the minimum temperature of the temperature range and the deficient temperature and ii) the heat-removal effectiveness parameter of the another channel-region area receiving the decreased flow rate.

An exemplary algorithm, and its associated tables, that implements the method of FIG. 6, and which can be implemented on any applicable platform, hardware system, or by using any operating system or platform known to those in the art for use in this context, such as VML, is supplied below:

Pre-Compute:
1. Calculate the wRC parameters for all Channel-Region combinations in the stack (for a given stack definition and technology parameters)
 (this can also be reduced to a number k of nearest neighbors of Channels with respect to a Region)
 store results in the look-up table T1.

TABLE T1

| T1: | R1 | R2 | ... | Rn |
|---|---|---|---|---|
| Ch1 | w11 | w12 | ... | w1n |
| Ch2 | w21 | w22 | ... | w2n |
| ... | ... | ... | ... | ... |
| Chm | wm1 | wm2 | ... | wmn |

2. For ∀Ri Region: identify the Top J Channels with a high wRC (where J is a parameter of the system, it can be 2-4) store results in the look-up table T2.

TABLE T2

| T2: | R1 | R2 | ... | Rn |
|---|---|---|---|---|
| 1 | t11 | t12 | ... | t1n |
| 2 | t21 | t22 | ... | t2n |
| ... | ... | ... | ... | ... |
| j | tj1 | tj2 | ... | tjn |

3. Define a temperature envelope: Tjmax, Tjmin
Run Time Operation:

```
Loop
    For i = 1 to m (number of channels)
        If T of any R influenced by Chi > Tjmax
            increase Chi flow rate proportional to dT overshoot and wiq
        else if T of any R influenced by Chi < Tjmin
            decrease Chi flow rate proportional to dT undershoot
            and wiq
        end if
    end for
end loop
```

It should be understood that a non-exclusive description of the above parameters includes: Chi refers to the ith channel, i.e. Ch1 is channel 1, and similarly Ri refers to the ith region, i.e. R1 is the region 1. "j" is a system parameter that depends on the system or stack at issue, i.e. the number of regions and channels and the maximum and minimum temperatures therein. The parameter wRC and/or wiq represents a heat-removal effectiveness parameter of a given channel-region area, i.e. w11 refers to the heat-removal effectiveness parameter of the channel-region area: channel 1 connected to region 1. Similarly, tjn represents the temperature of a j channel to an n region. i.e. t11 refers to the temperature of channel 1 on region 1. $T_{jmax}$ and $T_{jmin}$ represent the maximum and minimum temperatures in the system or stack, respectively. "dT" refers to a difference in temperature from a specific reference temperature, such as $T_{jmax}$ or $T_{jmin}$. Finally, Chi represents a flow rate of liquid that can exert a thermal effect on a 3-D chip-stack, such as coolant liquid, that flows through an ith channel.

The minimum and maximum temperature range, $T_{jmax}$ and $T_{jmin}$, can be defined in many appropriate manners, such as on what the maximum and minimum temperatures are for optimizing performance in the stack and/or a heat-removal effectiveness parameter of a channel-region area(s) of the chip-stack. The range can also be based on the extent of an identified difference between different heat removal parameters and/or by identifying the channel-region areas with the highest or lowest heat-removal parameters, and by extension having an understanding of when a critical temperature can be reached before or after liquid must be supplied or can be withheld. This range determination can also be context dependent on the material and physical parameters of a given stack.

Figure 8:
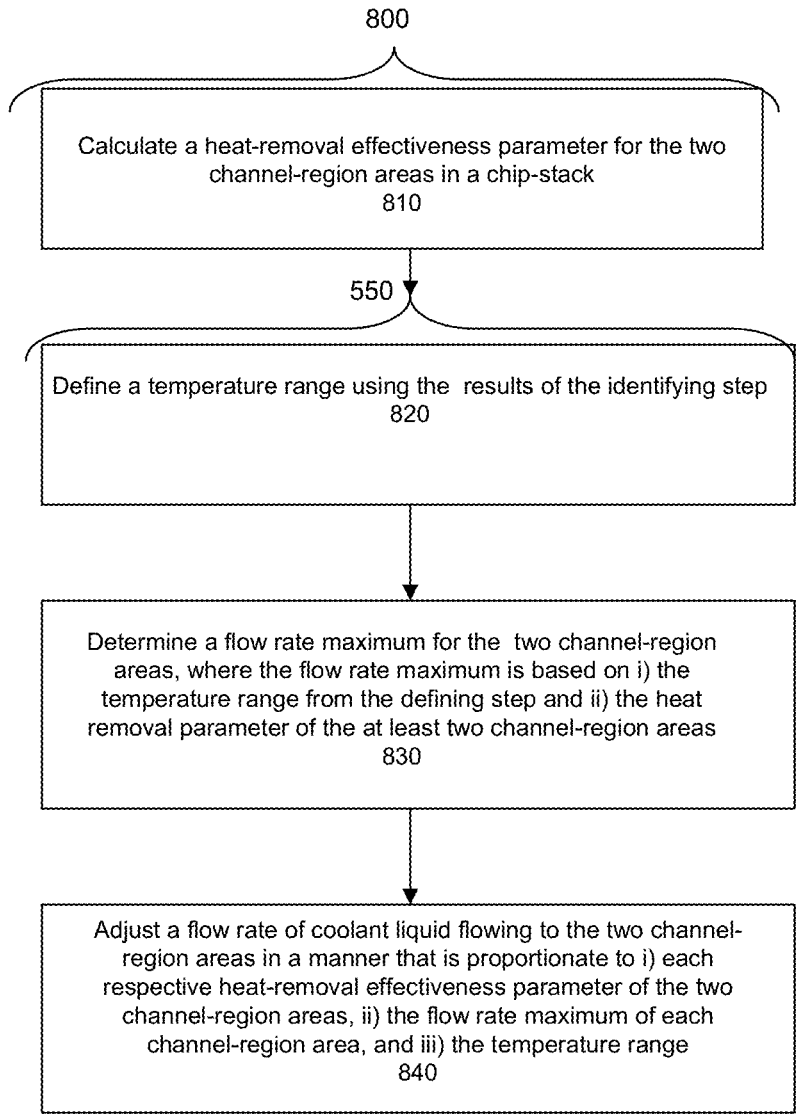
FIG. 8 is a block diagram that illustrates a computer-implemented method for optimizing heat transfer in a 3-D chip-stack according to an embodiment of the present invention.

Another embodiment of the Present Invention employs the above principles, and as show in FIG. 8, includes another method for optimizing heat transfer in a 3-D chip-stack using the principles outlined above by adding further steps to the adjusting step 550.

The first step 810 is optional, and it involves calculating a heat-removal effectiveness parameter for each of at least two channel-region areas in the chip-stack, where, again, a channel-region area includes at least one region in the 3-D chip-stack connected to at least one channel in the 3-D chip-stack. The computation, again, can be based on a parameter that is calculated by using the factors discussed above, including the i) distance between a channel and a region and ii) the effect of boundary materials connecting a channel and a region.

The next steps, 820, 830, and 840, add further steps to the adjusting step 550. Step 820 involves defining a temperature range using the results of the identifying step. The next step 830 involves determining a flow rate maximum for each of the at least two channel-region areas, where the flow rate maximum is based on i) the temperature range from the defining step and ii) the heat-removal effectiveness parameter of each of the at least two channel-region areas. The next step 840 involves adjusting a flow rate of coolant liquid flowing to each of the at least two channel-region areas in a manner that is proportionate to i) each respective Heat-Removal Effectiveness parameter of the at least two channel-region areas, ii) the flow rate maximum of each channel-region area, and iii) the temperature range. At least one step must be carried out using a computer device.

Figure 9:
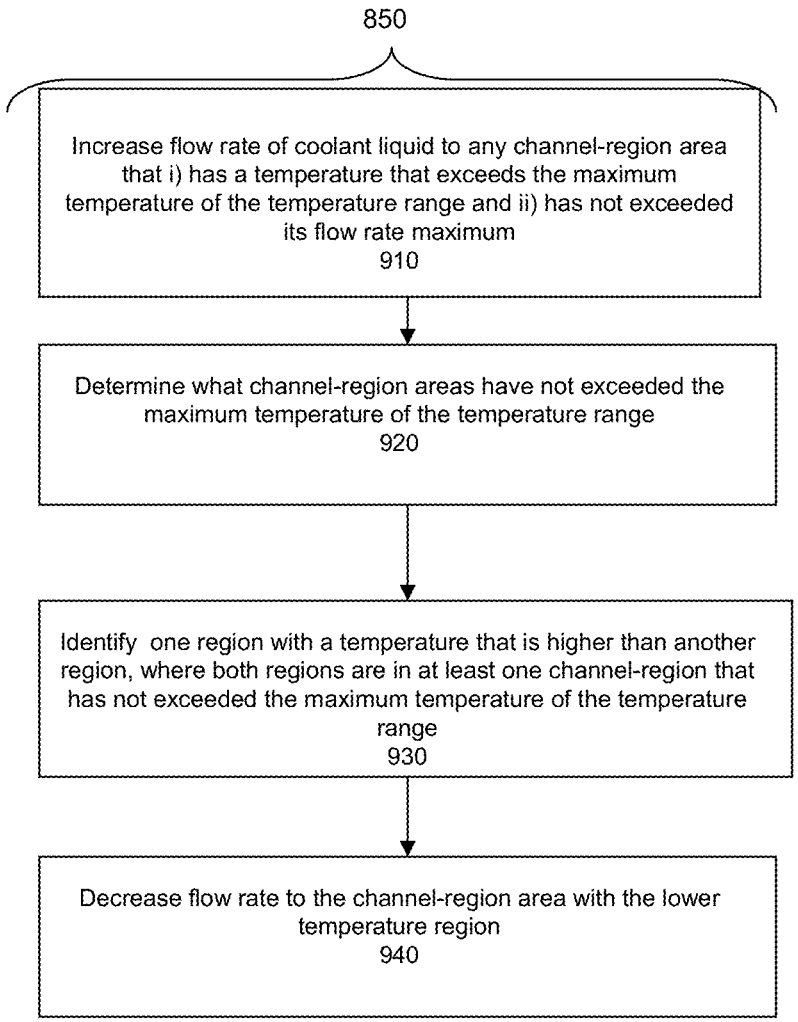
FIG. 9 is a block diagram that illustrates a computer-implemented method for optimizing heat transfer in a 3-D chip-stack according to an embodiment of the present invention.

Step 840 can include the additional steps illustrated in FIG. 9. Step 840 can further include step 910 such that the adjustment is further made by increasing flow rate of coolant liquid to any channel-region area that i) has a temperature that exceeds the maximum temperature of the temperature range and ii) has not exceeded its flow rate maximum. The increasing in flow rate can occur in a manner that is proportional to i) a temperature difference between the excessive temperature and the maximum temperature of the temperature range and ii) the heat-removal effectiveness parameter of the channel-region area receiving the increased flow rate.

Step 840 can also further include steps 920, 930, and 940 such that the adjustment is further made by: determining what channel-region areas have not exceeded the maximum temperature of the temperature range 920, identifying at least one region with a temperature that is higher than another region 930, where both regions are in at least one channel-region that has not exceeded the maximum temperature, and decreasing flow rate to the channel-region area with the lower temperature region 940. The decreasing in flow can be in a manner that is proportionate to i) the temperature difference between the maximum temperature and the temperature of the channel-region area with the lower temperature region and ii) the heat-removal effectiveness parameter of the channel-region area with the lower temperature region.

Further, in another embodiment, the identifying step 930 can further identify what channel-region areas contain regions that are below the minimum temperature, and then the decreasing 940 firstly and immediately reduces coolant liquid to these channel-region areas, and then, after that reduction, reduces coolant liquid flowing to the channel-region areas that are below the maximum temperature but above the minimum temperature.

An exemplary algorithm, and its associated tables, that implements the method of FIG. 8, and which can be implemented on any applicable platform, hardware system, or by using any operating system or platform known to those in the art for use in this context, such as VML, is supplied below:

Pre-Compute:
1. Calculate the wRC parameters for all Channel-Region combinations in the stack (for a given stack definition and technology parameters)
(this can also be reduced to a number k of nearest neighbors of Channels with respect to a Region)
store results in the look-up table T1.

TABLE T1

| T1: | R1 | R2 | ... | Rn |
|---|---|---|---|---|
| Ch1 | w11 | w12 | ... | w1n |
| Ch2 | w21 | w22 | ... | w2n |
| ... | ... | ... | ... | ... |
| Chm | wm1 | wm2 | ... | wmn |

2. For ∀Ri Region: identify the Top J Channels with high wRC (where J is a parameter of the system, it can be 2-4) store results in the look-up table T2.

TABLE T2

| T2: | R1 | R2 | ... | Rn |
|---|---|---|---|---|
| 1 | t11 | t12 | ... | t1n |
| 2 | t21 | t22 | ... | t2n |
| ... | ... | ... | ... | ... |
| j | tj1 | tj2 | ... | tjn | store results in the look-up table T2
2. For ∀Ri Region: identify the Top J Channels with high wRC (where J is a parameter of the system, it can be 2-4) store results in the look-up table T4
3. Define temperature/flow rate envelope: Tjmax, Tjmin, Vpmax(Ch)
Run Time Operation:

```
Loop
  For i = 1 to n % scan for all the regions
    If T of R > Tjmax % check if thermal overshoot
      for I = 1 to j % scan for all 1..j top channels related to
region n (T2)
        if flow rate of Ch tIn < Vpmax(Ch tIn) % check if flow
rate of Ch tIn is maximal
          increase Ch tIn flow rate proportional to dT overshoot
and wiq % adjust channel flow rate according to dT and its influence
parameter w (T1)
          quit for loop
        end if
      end for
    else if R < Tjmin % check if thermal undershoot
      for I = 1 to j % scan for all 1..j top channels related to
region n (T2)
        search for all regions influenced by Ch tIn
        read highest Tj of these regions
        if maximal Tj of any Region influenced by Ch tIn < Tjmax
% check if flow rate of Ch tIn can be reduced
          decrease Ch tIn flow rate proportional to dT from
maximal Tj to Tjmax and w of that region % adjust channel flow rate
according to dT and its influence parameter w (T1)
          quit for loop
        end if
      end for
    end if
end loop
```

It should be understood that a non-exclusive description of the above parameters includes: Chi refers to the ith channel, i.e. Ch1 is channel 1, and similarly Ri refers to the ith region, i.e. R1 is the region 1. "j" is a system parameter that depends on the system or stack at issue, i.e. the number of regions and channels and the maximum and minimum temperatures therein. The parameter wRC and/or wiq represents a heat-removal effectiveness parameter of a given channel-region area, i.e. w11 refers to the heat-removal effectiveness parameter of the channel-region area: channel 1 connected to region 1. The heat-removal effectiveness parameter can also be associated or functionally expressed by an associated temperature, i.e. w(T1). Similarly, tjn represents the temperature of a j channel to an n region. i.e. t11 refers to the temperature of channel 1 on region 1. $T_{jmax}$ and $T_{jmin}$ represent the maximum and minimum temperatures in the system or stack, respectively. "dT" refers to a difference in temperature from a specific reference temperature, such as $T_{jmax}$ $T_{jmin}$. Chi represents a flow rate of liquid that can exert a thermal effect on a 3-D chip-stack, such as coolant liquid, that flows through an ith channel. Finally, Vp(Chi) refers to a flow rate function of a given ith channel, and $V_{pmax}$ refers to the maximal flow rate for a given channel.

The maximum flow rate can be defined in many appropriate manners, such as on what the maximum possible flow rate for a particular channel based on its material and physical limitations. The flow rate maximum can also be defined by considering other factors, such as one of or a combination of the heat-removal parameters, or a temperature value, such as $T_{jmax}$ or $T_{jmin}$.

As stated above, the minimum and maximum temperature range, $T_{jmax}$ and $T_{jmin}$, can be defined in many appropriate manners, such as on what the maximum and minimum temperatures are for optimizing performance in the stack and/or a heat-removal effectiveness parameter of a channel-region area(s) of the chip-stack. The range can also be based on the extent of an identified difference between different heat removal parameters and/or by identifying the channel-region areas with the highest or lowest heat-removal parameters, and by extension having an understanding of when a critical temperature can be reached before or after liquid must be supplied or can be withheld. This range determination can also be context dependent on the material and physical parameters of a given stack.

The above methods, i.e. 500, 600, 700, 800, and 900 work for any number of channel-region areas, and can include all of the conceivable channel-region areas in the chip-stack. Any one of those methods can be used on at least two channel-region areas in the chip-stack, where there are at least a total of two channels amongst the at least two channel-region areas, and where a heat-removal effectiveness parameter is obtained for each one of the channel-region areas.

Figure 10:
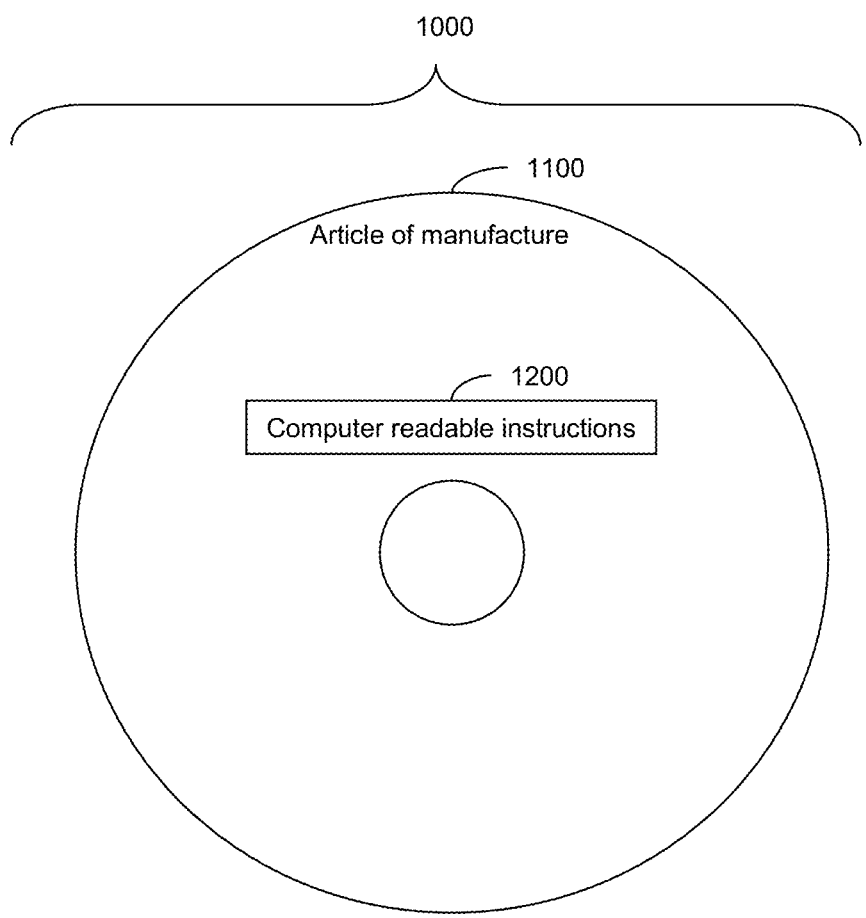
FIG. 10 is an illustration of an article of manufacture for carrying out the steps of the methods according to embodiments of the present invention.

According to a further embodiment of the present invention, an article of manufacture is provided that includes a computer readable medium having computer readable instructions embodied therein for performing the steps of the computer-implemented methods, including but not limited to 500, as displayed in FIG. 5 and described above. FIG. 10 illustrates the article of manufacture 1000 that includes a computer readable medium having computer readable instructions 1200 for carrying out the steps of the methods described above, including 500 discussed above with reference to FIG. 5.

A combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for the embodiments of the present invention may be written in any combination of one or more programming languages, including an object oriented programming language such as Java, Smalltalk, C++ or the like and conventional procedural programming languages, such as the "C" programming language or similar programming languages. Any other program or platform mentioned above can, of course, also be used.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Figure 11:
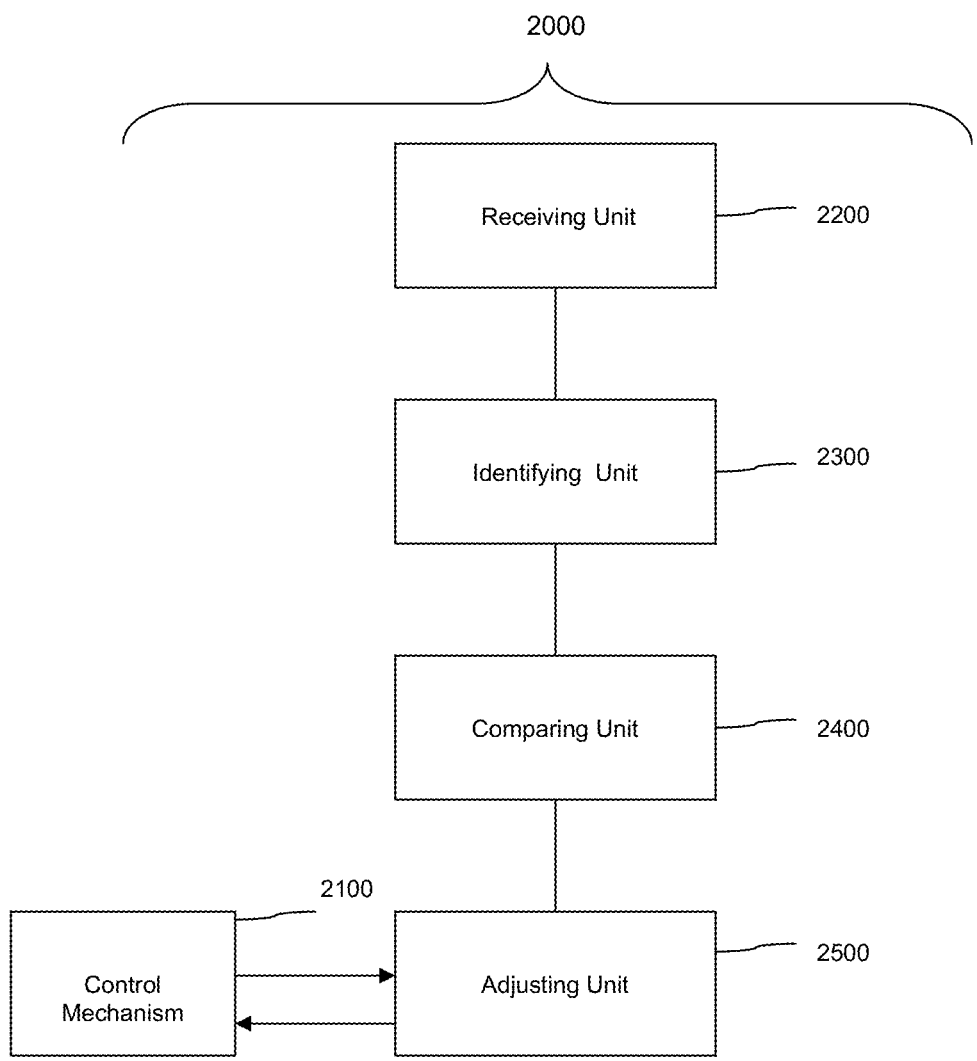
FIG. 11 is a block diagram that illustrates a heat optimization computer system for optimizing heat transfer in a 3-D chip-stack according to an embodiment of the present invention.

According to FIG. 11, another embodiment of the present invention is provided, a heat optimization computer system for optimizing heat transfer in a 3-D chip-stack 2000. The system includes: a control mechanism 2100, a receiving unit 2200, an identifying unit 2300, a comparing unit 2400, and an adjusting unit 2500.

The control mechanism 2100 is configured to supply and control the delivery of liquid to the chip-stack. The liquid can be (i) coolant liquid, (ii) heating liquid, or (iii) a combination of heating and cooling liquid. The control mechanism can be eSPCS as described above, it can employ thermal diodes, or it can be any other controller known in the art that is capable of being configured to supply liquid to a 3-D chip-stack.

The receiving unit 2200 is configured to receive a heat-removal effectiveness parameter for a plurality of channel-region areas in the chip-stack. The identifying unit 2300 is configured to identify at least two channel-region areas of the plurality of channel-region areas with different heat-removal effectiveness parameters from one another, i.e. channel-region 1 has a different Heat-Removal effectiveness parameter than channel-region 2. The receiving unit 2200 is also configured to also receive at least one of a flow value and a temperature value for each of the at least two of the plurality of channel-region areas. Again, a channel-region area includes at least one region in the 3-D chip-stack connected to at least one channel in the 3-D chip-stack.

Also, as mentioned above, a flow value can be a parameter that assesses the flow of liquid entering the channel-region area, such as the flow rate, and a temperature value can be one of the actual value of the temperature of a part or all of the channel-region area, the desired value of a part or all of the temperature of the channel-region area, a predicted value of the temperature of a part or all of the channel-region area, or a temperature value that a part or all of the channel-region area can have based on its physical and material parameters and the current and/or potential external circumstances.

Figure 12:
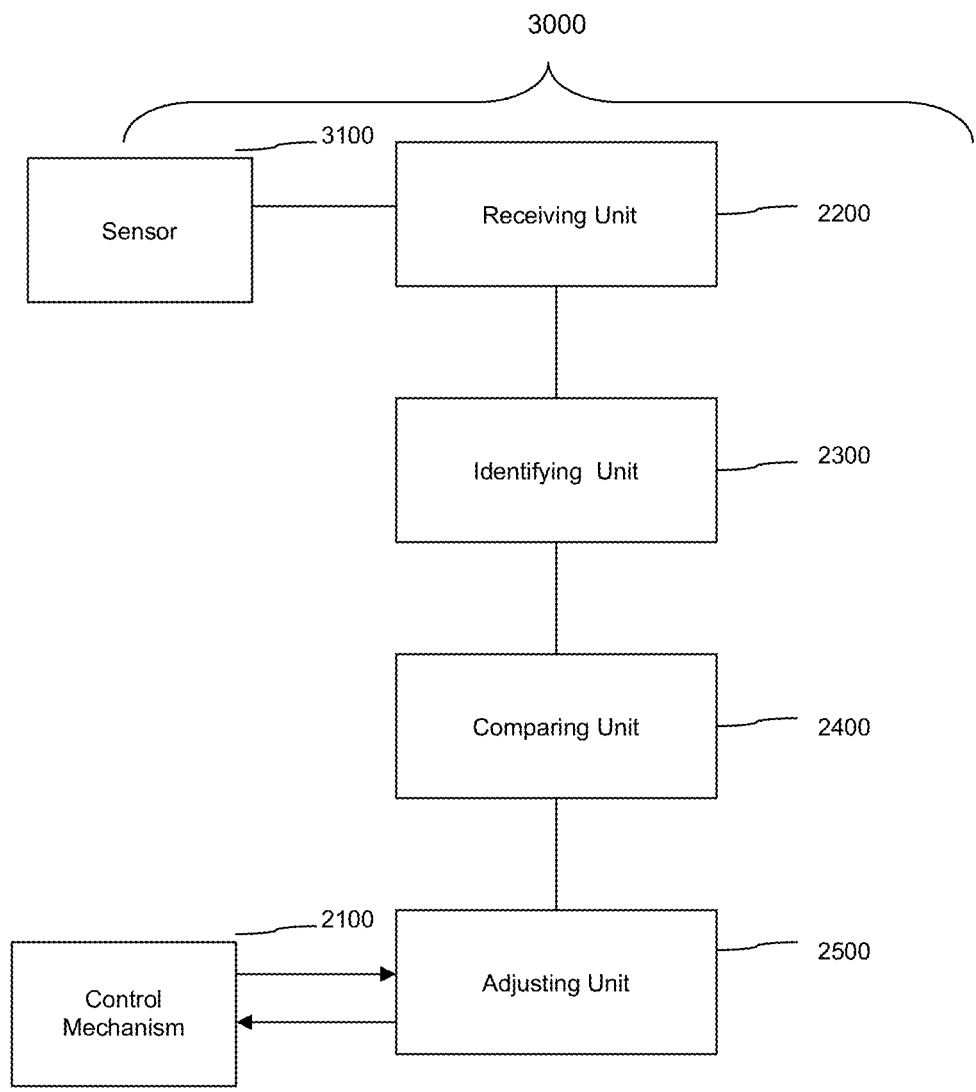
FIG. 12 is a block diagram that illustrates a heat optimization computer system for optimizing heat transfer in a 3-D chip-stack according to an embodiment of the present invention.

As illustrated in FIG. 12, the system can be modified so as to form a system 3000 that includes a sensor or sensors 3100 that are embeddable in one, more than one, or all of the channel-region areas. The sensor or sensors can be used to obtain a measurement of a relevant physical feature, such as the temperature of a channel-region area, the flow rate in a channel region area, etc.

The comparing unit 2400 is configured to compare the received values for different channel-region areas. This comparison can assess one or more differences or similarities for one or more of the values amongst two or more of the channel-region areas.

The adjusting unit 2500 is configured to instruct the control mechanism as to the manner that the control mechanism is to supply flow rate of liquid to at least one of the at least two channel-region areas. The control unit will then supply liquid based on the i) the heat-removal effectiveness parameter of the channel-region area receiving the adjustment and ii) the comparison results provided by the comparing unit. The adjustment can be done using liquid that is (i) coolant liquid, (ii) heating liquid, or (iii) a combination of heating and cooling liquid. Depending on the operational mode at issue it may be useful to use a different type of liquid, i.e. for the burn-in-state it can be heating liquid to burn in the chip, and it can be coolant liquid when the chip is being cooled. This comparison can be proportionate to the heat-removal effectiveness parameter(s) of the channel-region area(s) receiving the adjustment and the results of the comparison step.

The identifying unit is optional, and the system can be constructed without it. This identifying performed by the identifying unit can be done to (i) determine the order of the adjustment or (ii) establish a range for at least one of the values. For example, the channel-region areas with the higher-heat removal effectiveness parameters can be identified so that, depending on the specific needs at issue, they can receive a liquid adjustment first, last, or not at all, and/or so that a temperature range can be established.

In one embodiment, the identifying unit 2300 involves identifying the channel-region areas with the highest heat-removal effectiveness parameters relative to other channel-region areas. This permits the adjusting step to deliver liquid most efficiently depending on the circumstances. For instance, in the scenarios where coolant liquid is needed to reduce temperature throughout the chip, more coolant liquid can be diverted to channel-region areas with lower heat-removal effectiveness parameters because the channel-region areas with higher heat-removal parameters lose heat more easily by their very nature, and as a result, require less coolant liquid to do so. The opposite can be done in scenarios where heating liquid is required because the channel-region areas with lower heat-removal parameters sustain heat with greater ease than channel-region areas with higher heat-removal effectiveness parameters.

Figure 13:
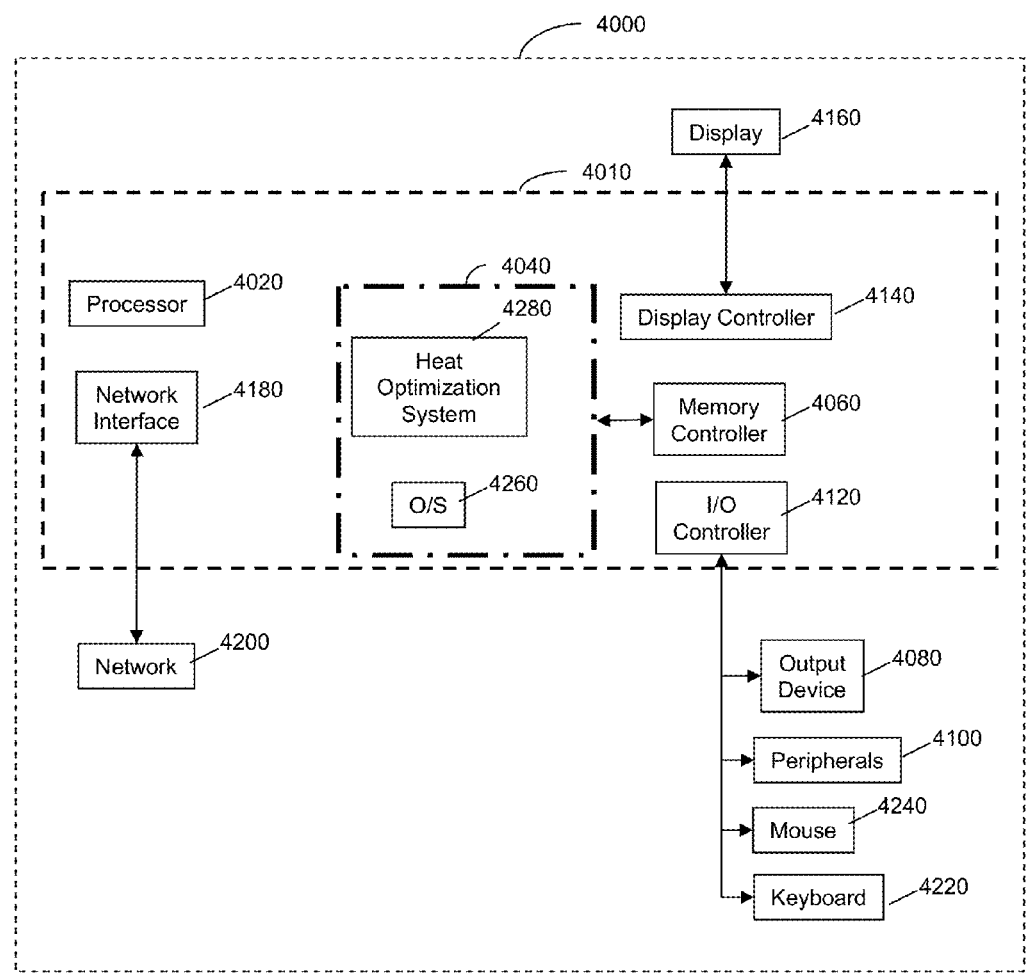
FIG. 13 is a block diagram that illustrates a computer-implemented system that includes a heat optimization system for optimizing heat transfer in a 3-D chip-stack according to an embodiment of the present invention.

FIG. 13 displays an exemplary computing system capable of employing the heat optimization systems of 2000 and 3000 as illustrated in FIG. 11 and in FIG. 12, respectively. This system is merely exemplary and those skilled in the art can employ alternative systems consistent with the present invention. As can be appreciated, the computing system 4000 may include a computing device, including but not limited to, a desktop computer, a laptop, a server, a portable handheld device, or any other electronic device. For ease of the discussion, an embodiment of the invention will be discussed in the context of the computer 4010.

The computer 4010 is shown to include a processor 4020, memory 4040 coupled to a memory controller 4060, one or more input and/or output (I/O) devices, peripherals 4080, 4100 that are communicatively coupled via a local input/output controller 4120, and a display controller 4140 coupled to a display 4160. In an exemplary embodiment, the system 4000 can further include a network interface 4180 for coupling to a network 4200. The network 4200 transmits and receives data between the computer 4010 and external systems. In an exemplary embodiment, a conventional keyboard 4220 and mouse 4240 can be coupled to the input/output controller 4200.

In various embodiments of the present invention, the memory 4040 stores instructions that can be executed by the processor 4020. The instructions stored in memory 4040 may include one or more separate programs, each of which includes an ordered listing of executable instructions for implementing logical functions. In the example of FIG. 13, the instructions stored in the memory 4040 include at least a suitable operating system (OS) 4260 and a heat optimization system 4280. This system can be system 2000 without the sensor or with the sensor 3100. The operating system 4260 essentially controls the execution of other computer programs and provides scheduling, input-output control, file and data management, memory management, and communication control and related services.

When the computer 4010 is in operation, the processor 4020 is configured to execute the instructions stored within the memory 4040, to communicate data to and from the memory 4040, and to generally control operations of the computer 4010 pursuant to the instructions. The processor 4020 can be any custom made or commercially available processor, a central processing unit (CPU), an auxiliary processor among several processors associated with the computer 4010, a semiconductor based microprocessor (in the form of a microchip or chip set), a macroprocessor, or generally any device for executing instructions.

The processor 4020 executes the instructions of the heat optimization system 4280 according to embodiments of the present invention. In various embodiments, the heat optimization system 4280 of the present invention is stored in the memory 4040 (as shown), is executed from a portable storage device (e.g., CD-ROM, Diskette, FlashDrive, etc.) (not shown), and/or is run from a remote location such as from a central server (not shown). The data processing system 4280 may be a software application that carries out a process such as described above with reference to FIG. 5. In some embodiments of the present invention, memory 4040 also stores data, such as received data items from a network and data produced or executed by the methods of the present invention, including FIG. 5.

What is claimed is:

1. A computer-implemented method for optimizing heat transfer in a 3-D chip-stack, the method comprising the steps of:
   receiving a heat-removal effectiveness parameter for a plurality of channel-region areas in the chip-stack;
   identifying at least two channel-region areas of the plurality of channel region areas with different heat-removal effectiveness parameters;
   receiving at least one of a flow value and temperature value for at least two of the plurality of channel-region areas;
   comparing the received values for different channel-region areas; and
   adjusting a flow rate of a liquid flowing to at least one of the two channel-region areas based on the heat-removal effectiveness parameter of the channel-region area receiving the adjustment and the results of the comparison step;
   wherein at least one step is carried out using a computer device;
   wherein the identified at least two channel-region areas and the subsequent value-received at the at least two channel-region areas are the same;
   wherein the results of the identifying step are used for one of (i) determining the order of the adjustment or (ii) establishing a range for at least one of the values
   wherein the liquid is one of (i) a coolant liquid, (ii) a heating liquid, or (iii) a combination of coolant liquid and heating liquid; and
   wherein the adjusting occurs in a manner that is proportionate to the heat-removal effectiveness parameter of the channel-region area receiving the adjustment and the results of the comparison step.

2. The computer-implemented method according to claim 1 further comprising the step of: calculating the heat-removal effectiveness parameter of each of the at least two channel-region areas.

3. The computer-implemented method according to claim 2, wherein each heat-removal effectiveness parameter is calculated by using factors selected from the group consisting of: i) distance between a channel and a region and ii) effect of boundary materials connecting a channel and a region.

4. The computer-implemented method according to claim 3, wherein the identified at least two channel-region areas of the plurality of channel-region areas are identified by the identifying step as having higher heat-removal parameters relative to the other channel-region areas, and wherein the adjusting step further comprises the steps of:
   defining a temperature range with a minimum and maximum value using the results of identifying step; and
   increasing flow rate of coolant liquid to at least one of the at least two channel-region areas with a temperature that exceeds the maximum temperature of the temperature range.

5. The computer-implemented method according to claim 4, wherein the increasing in flow rate occurs in a manner that is proportionate to i) a temperature difference between the excessive temperature and the maximum temperature of the temperature range and ii) the heat-removal effectiveness parameter of the channel-region area receiving the increased flow rate.

6. The computer-implemented method according to claim 5, wherein the adjusting step further comprises the step of: decreasing flow rate of coolant liquid to another one of the at least two channel-region areas with a temperature that is less than the minimum temperature of the temperature range.

7. The computer-implemented method according to claim 6, wherein the decreasing flow rate of coolant liquid is done in a manner that is proportionate to i) a temperature difference between the minimum temperature of the temperature range and the deficient temperature and ii) the heat-removal effectiveness parameter of the another channel-region area receiving the decreased flow rate.

8. The computer-implemented method according to claim 3, wherein the identified at least two channel-region areas of the plurality of channel-region areas are identified by the identifying step as having higher heat-removal parameters relative to the other channel-region areas, and wherein the adjusting step further comprises the steps of:
   defining a temperature range with a minimum and maximum value using the results of the identifying step;
   determining a flow rate maximum for each of the at least two channel-region areas, wherein the flow rate maximum is based on i) the temperature range from the defining step and ii) the heat-removal effectiveness parameter of each of the at least two channel-region areas; and
   adjusting a flow rate of coolant liquid flowing to each of the at least two channel-region areas in a manner that is proportionate to i) each respective heat-removal effectiveness parameter of the at least two channel-region areas, ii) the flow rate maximum of each channel-region area, and iii) the temperature range.

9. The method according to claim 8, wherein the adjusting step further comprises the step of: increasing flow rate of coolant liquid to any channel-region area that i) has a temperature that exceeds the maximum temperature of the temperature range and ii) has not exceeded its flow rate maximum.

10. The method according to claim 9, wherein the increasing in flow rate occurs in a manner that is proportionate to i) a temperature difference between the excessive temperature and the maximum temperature of the temperature range and ii) the heat-removal effectiveness parameter of the channel-region area receiving the increased flow rate.

11. The method according to claim 10, wherein the adjusting step further comprises the steps of:
   determining what channel-region areas have not exceeded the maximum temperature of the temperature range;

identifying any region with a temperature that is higher than another region, wherein both regions are in at least one channel-region area that has not exceeded the maximum temperature; and decreasing flow rate to the channel-region area with the lower temperature region.

12. The method according to claim 11, wherein the decreasing in flow rate is in a manner that is proportionate to i) the temperature difference between the maximum temperature and the temperature of the channel-region area with the lower temperature region and ii) the heat-removal effectiveness parameter of the channel-region area with the lower temperature region, wherein the identifying step further comprises: identifying which channel-region areas of the not exceeding channel-region areas have a region with a temperature below the temperature minimum, and wherein the decreasing in flow rate occurs first for the channel-regions areas that contain the below minimum temperature regions.

13. The computer-implemented method according to claim 12, wherein each heat-removal effectiveness parameter is calculated by using factors selected from the group consisting of: i) distance between a channel and a region and ii) effect of boundary materials connecting a channel and a region.

14. A heat optimization computer system for optimizing heat transfer in a 3-D chip-stack, the system comprising:
a control mechanism for supplying liquid to the chip-stack;
a receiving unit for receiving a heat-removal effectiveness parameter for a plurality of channel-region areas in the chip-stack and for receiving at least one of a flow value and temperature value for at least two of the plurality of channel-region areas;
an identifying unit for identifying at least two channel-region areas of the plurality of channel region areas with different heat-removal effectiveness parameters;
a comparing unit for comparing the received values for different channel-region areas; and
an adjusting unit that instructs the control mechanism as to the manner that the control mechanism is to supply flow rate of liquid to at least one of the at least two channel-region areas, wherein the adjustment is based on the heat-removal effectiveness parameter of the channel-region area receiving the adjustment and the results provided by the comparison unit;
wherein the identified at least two channel-region areas and the subsequent value-received at the at least two channel-region areas are the same;
wherein the results of the identifying step are used for one of (i) determining the order of the adjustment or (ii) establishing a range for at least one of the values
wherein the liquid is one of (i) a coolant liquid, (ii) a heating liquid, or (iii) a combination of coolant liquid and heating liquid; and
wherein the adjusting occurs in a manner that is proportionate to the heat-removal effectiveness parameter of the channel-region area receiving the adjustment and the results of the comparison step.

15. The system according to claim 14, wherein the control mechanism employs thermal diodes to control the coolant liquid, and the system further comprises: a sensor embedded in the chip-stack, wherein, prior to the execution of any of the functions performed by the other units, the sensor obtains a temperature of the channel-region area that receives the adjustment, and wherein the sensor supplies the data to the receiving unit.

16. The system according to claim 14 further comprising: a calculating unit for calculating the heat-removal effectiveness parameter of each of the at least two channel-region areas.

17. A non-transitory article of manufacture tangibly embodying computer readable instructions which when implemented cause a computer to carry out the steps of a method for optimizing heat transfer in a 3-D chip-stack, the method comprising the steps of:
receiving a heat-removal effectiveness parameter for a plurality of channel-region areas in the chip-stack;
identifying at least two channel-region areas of the plurality of channel region areas with different heat-removal effectiveness parameters;
receiving at least one of a flow value and temperature value for at least two of the plurality of channel-region areas;
comparing the received values for different channel-region areas; and
adjusting a flow rate of a liquid flowing to at least one of the two channel-region areas based on the heat-removal effectiveness parameter of the channel-region area receiving the adjustment and the results of the comparison step;
wherein the identified at least two channel-region areas and the subsequent value-received at the at least two channel-region areas are the same;
wherein the results of the identifying step are used for one of (i) determining the order of the adjustment or (ii) establishing a range for at least one of the values
wherein the liquid is one of (i) a coolant liquid, (ii) a heating liquid, or (iii) a combination of coolant liquid and heating liquid; and
wherein the adjusting occurs in a manner that is proportionate to the heat-removal effectiveness parameter of the channel-region area receiving the adjustment and the results of the comparison step.

18. The computer-implemented method according to claim 17, wherein the method further comprises the step of: thermally stressing the chip-stack during a Burn-in test using heating liquid.

19. The computer-implemented method of claim 18, wherein at least one channel that is contained in at least two channel-region areas is used as a shield to protect thermally sensitive layers from the heat produced in the Burn-in state.

20. The computer-implemented method according to claim 17 further comprising the step of: calculating the heat-removal effectiveness parameter of each of the at least two channel-region areas.

21. The computer-implemented method according to claim 20, wherein each heat-removal effectiveness parameter is calculated by using factors selected from the group consisting of: i) distance between a channel and a region and ii) effect of boundary materials connecting a channel and a region.

22. The computer-implemented method according to claim 21, wherein the identified at least two channel-region areas of the plurality of channel-region areas are identified by the identifying step as having higher heat-removal parameters relative to the other channel-region areas, and wherein the adjusting step further comprises the steps of:
defining a temperature range with a minimum and maximum value using the results of identifying step; and
increasing flow rate of coolant liquid to at least one of the at least two channel-region areas with a temperature that exceeds the maximum temperature of the temperature range.

* * * * *